(12) United States Patent
Kim et al.

(10) Patent No.: US 6,183,942 B1
(45) Date of Patent: Feb. 6, 2001

US006183942B1

(54) THINNER COMPOSITION FOR REMOVING SPIN-ON-GLASS AND PHOTORESIST

(75) Inventors: Byung-Uk Kim, Kyungki-do; Ji-Hum Baik, Yongin; Chang-Il Oh, Seongnam; Sang-Dai Lee, Kyungki-do; Won-Lae Kim; Chong-Soon Yoo, both of Seoul, all of (KR)

(73) Assignee: Dongjin Semichem Co., Ltd., Incheon (KR)

( * ) Notice: Under 35 U.S.C. 154(b), the term of this patent shall be extended for 0 days.

(21) Appl. No.: 09/429,535

(22) Filed: Oct. 28, 1999

(30) Foreign Application Priority Data

Apr. 15, 1999 (KR) ................................................. 99-13223
Jul. 20, 1999 (KR) ................................................. 99-29370

(51) Int. Cl.$^7$ ........................................................ G03F 7/42
(52) U.S. Cl. ............................... 430/331; 510/176; 134/1.3
(58) Field of Search ........................... 430/331; 510/176; 134/1.3

(56) References Cited

U.S. PATENT DOCUMENTS

| 4,886,728 | 12/1989 | Salamy et al. ........................ | 430/331 |
| 4,948,697 | * 8/1990 | Durham ................................ | 430/165 |
| 4,983,490 | 1/1991 | Durham ................................ | 430/169 |
| 5,612,303 | * 3/1997 | Takayanagi et al. ................. | 510/174 |
| 5,759,736 | * 6/1998 | Nishi et al. ........................... | 430/190 |
| 5,866,305 | 2/1999 | Chon et al. ........................... | 430/331 |
| 6,090,518 | * 7/2000 | Niinomi et al. ...................... | 430/170 |

FOREIGN PATENT DOCUMENTS

| 936110   | 2/1977 | (JP) . |
| 6369563  | 3/1988 | (JP) . |
| 3203240  | 9/1991 | (JP) . |
| 442523   | 2/1992 | (JP) . |
| 449938   | 2/1992 | (JP) . |
| 4130715  | 5/1992 | (JP) . |
| 7146562  | 6/1995 | (JP) . |
| 7160008  | 6/1995 | (JP) . |
| 62230828 | 7/1995 | (JP) . |
| 7242747  | 9/1995 | (JP) . |
| 8203876  | 8/1996 | (JP) . |

OTHER PUBLICATIONS

Journal of Vacuum Science and Technology vol. A9 No. 5, 1991, p2696, Ito, S. et al.
Journal of Vaccum Science and Technology vol. B7, p1771, 1989, Chiong, K. et al.
Proc. SPIE., vol. 1262; p32,1990, Nalamasu, O. et al.

* cited by examiner

*Primary Examiner*—Janet Baxter
*Assistant Examiner*—Rosemary Ashton
(74) *Attorney, Agent, or Firm*—Baker Botts L.L.P.

(57) ABSTRACT

The present invention relates to a thinner composition for removing a spin-on-glass coating and a photoresist which are used in the semiconductor components manufacturing process.

The present invention provides a mixed thinner composition which is mixed propylene glycol monoalkyl ether with monooxycarbonic acid ester, alkyl ethanoate, and alkyl lactate in a thinner composition for cleaning and photoresist removal applications in the semiconductor components manufacturing process.

A thinner composition according to the present invention has the beneficial effects that the production yield can be improved during semiconductor component manufacturing since when the thinner composition is applied after the spin coating process, the undesired coating of the edge or the backside of the substrate can be removed promptly, completely, and effectively, and residual materials adhering to the surface of a substrate which must be reuse can be completely removed so that the substrate can be economically used.

5 Claims, 16 Drawing Sheets

THINNER COMPOSITION FOR REMOVING SPIN-ON-GLASS AND PHOTORESIST

BACKGROUND OF THE INVENTION (a) Field of the Invention

The present invention relates to a thinner composition for removing spin-on-glass and photoresist which is used in the semiconductor component manufacturing process. More particularly, the present invention relates to a thinner composition that can be used in washing and removing the unnecessary spin-on-glass ("SOG") of an SOG layer at edges and a backside of a substrate, the SOG layer being produced when an oligomer solution of an organic silicon compound having a siloxane bond is spin-coated on a substrate during the formation of an intermediate insulated layer. The present also relates to a thinner composition that can be used in washing and removing photoresist from the edges and the backside of a substrate, the photoresist being used as a mask in a photolithography process.

(b) Description of the Related Art

The width and distance of components, i.e., the distances between the dimensions of metal wiring are experiencing increasing reductions as Large Scale Integrated circuits ("LSI") become microscopic, highly integrated, and multi-layered. On the other hand, the component height of metal wiring, etc. has withnessed only minimal reductions so as not to increase wiring resistance and electric current density. Therefore, as side gap dimensions between metal wirings are becoming extremely narrowed, wiring height must naturally increase. As this type of wiring is formed by high anisotropic etching, the edges of the wiring have a sharp slope, and the number of wiring crossings and holes increase. Furthermore, the surface topography of LSI chips becomes greater due to the multi-layering of the wiring.

When wiring is formed on a surface with such severe protrusions and depressions, anisotropic wiring etching can leave residue at the sides of walls where there is a substrate topography that can lead to short circuits. In order to resolve this type of problem, there is a need to planarize sublayers to a minimum between wiring layers. Particularly, when the surface of an intermediate insulated layer on the primary aluminum wiring layer has not been sufficiently planarized, this leads to wiring short circuits on the upper layer and faults in confidence testing.

Accordingly, a siloxane oligomer solution, referred to as spin-on-glass (SOG), is used for the purpose of both acting as an intermediate insulated layer between wiring in the semiconductor multi-layer wiring process and planarizing a wiring layer before the next wiring process. Such SOG is typically structures such that an alkyl group side chain is bonded to a main chain of —Si—O—Si— as represented in the below General Formula 1:

[General Formula 1]

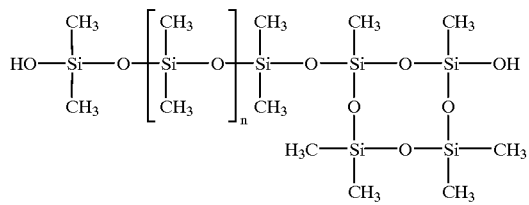

where n is an inter equal to or greater than one.

The above SOG has been disclosed in literature (Journal of Vacuum Science and Technology Vol. A9 No. 5, 1991, p2696), patents (Japanese Laid-open Patent No. Showa 62-230828, Japanese Laid-open Patent No. Heisei 7-40 242747, and Japanese Laid-open Patent No. Heisei 9-260384), and other publications.

Furthermore, a material which provides the SOG with a photosensitive characteristic on an insulated layer capable of patterning in a semiconductor device was disclosed in Patents including Japanese Laid-open Patent No. Heisei 9-36110, and Japanese Laid-open Patent No. Heisei 8-203876.

In the formation of an intermediate insulated layer, when the oligomer solution of an organic silicon compound having a siloxane bond is spin-coated on the substrate and baked, the insulated layer of silicon oxide material is made by heated condensation polymerization. In this spin-on-glass process, a solution is used to penetrate into the microscopic wiring, filling in level differences to be evened out. A low temperature process is possible as condensation polymerization occurs below 400° C. Furthermore, regular processing technologies such as the conventional etching, etc., can still be employed as the resulting insulated layer is a silicon oxide substrate.

Although the process in which this SOG solution is spin-coated to form a film is similar to the below described photolithography process, the process for washing and removing the undesired SOG coating, generated during spin-coating, at the edges and backside of the substrate is essential.

A thinner composition can remove the SOG coating at the edges and backside of the substrate quickly and thoroughly. It is also useful in removing undesired photoresist generated when a photosensitive resin composition is spin-coated. The photoresist is used as a mask in the photolithography process for the microscopic circuit patterning.

The photolithography process in the semiconductor component manufacturing process is an electronic circuit forming technique accomplished through the steps of coating a photoresist on a substrate, transferring a pattern according to the original design, and cutting according to the transferred pattern, i.e., the etching process.

This photolithography process is performed through various processes including:

a) a coating process in which a photoreist is uniformly coated on a substrate;

b) a soft baking process in which a photoresist is adhered to a wafer surface by evaporating a solvent from of the coated photoresist;

c) an exposing process in which a mask pattern is transferred on the substrate by the consecutive scale-down projection of a light source, such as ultraviolet rays, into a circuit pattern on the mask repeatedly to thereby expose the substrate;

d) a development process in which the areas having different physical properties, such as a difference in solubility due to the photosensitive-activity resulting from exposure to the light source, are removed using a developer;

e) a hard baking process in which a residual photoresist on a substrate is more strongly affixed after the development process;

f) an etching process in which certain parts are etched to provide electrical characteristics according to a pattern of the developed substrate; and g) a stripping process in which unnecessary photoresist is removed after the above processes.

Multiple microscopic circuits are formed on a substrate in order to ultimately manufacture an integrated semiconductor circuit through this photolithography process. Foreign materials, for example particles, should be eliminated to prevent their introduction into the fine gaps between the circuit wiring in these processes. Particles existing on a substrate can cause the various faults in the subsequent processes, such as etching, ion implantation, etc., resulting in decreased total productivity. It has been found that the main source of these unwanted particles is the unused photosensitive solution present at the periphery of the coated substrate.

In the above photolithography process, these edge beads of photosensitive materials can be produced after the spin-coating process in which a photoresist is applied to a substrate and the substrate is then rotated making the photoresist spread out evenly on the surface by the action of centrifugal force.

Photoresist inclined toward the edge and backside regions of a substrate by the centrifugal force is formed into small spherical shapes in this spin-coating process. This spherical shapes can be a source of particles in the apparatus after it is passed through the baking process and can be released during the transportation of a substrate, or can become a source of defocus during the light exposure process. As these undesired photosensitive materials become a source of apparatus contamination, reducing the yield of the semiconductor component manufacturing process, a spray nozzle is installed at edge parts of the substrate and at the upper and lower backside parts. A thinner composition composed of organic solvent constituents is sprayed through the nozzles to remove these excess photosensitive materials.

The practical aspects of chemically amplified resist are reviewed as follows. In a patterning method using a chemically amplified resist employing a novolak phenolic resin, a problem results in that a pattern which was formed by an absorption effect caused by a binder resin and a cross-linking resin becomes a reverse taper when an exposing light source was changed from the conventional G/I-line light source to an excimer laser light source (Journal Vacuum Science Technology., Vol. B7, p1771, 1989).

A positive type chemically amplified resist was suggested in literature as an alternative for this (Proc. SPIE., Vol. 1262, p32, 1990). This chemically amplified resist has a multi-constituent composition comprising an acid generator which produces acids when it is irradiated, and a compound which is reacted by these acids. A polymer compound which is reacted by these acids is known to have a structure as represented in General Formula 2:

[General Formula 2]

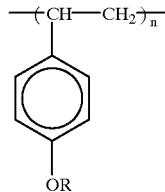

wherein n is an inter greater than or equal to one, and R is an alkoxycarbonyl group, alkyl group, alkoxyalkyl group, alkylsilyl group, tetrahydropyranyl group, alkoxycarbonyl methyl group, etc., compounds which can be easily decomposed when reacted by acids. As it has as a main constituent, a polymer compound such as a polyvinyl phenol derivative in which photoabsorption occurs in the short wavelength range, the chemically amplified resist becomes more transparent, and has a high sensitivity and resolution as a resist reaction progresses by a chain reaction due to an acid catalyst.

A polyvinyl phenol derivative receives a strong multiple reflection effect by light reflected from a lower part of the substrate due to a high transmittance of excimer laser light as described in the above. Multiple reflections within a membrane are generated by interference between the irradiated light (1) and the reflective light from a lower part of the substrate as shown in FIG. 5. FIG. 6 shows that the pattern dimensions vary greatly according to a thickness of the resist film.

Separately, a variety of problems are generated by the type of irradiating source used during the light exposure process. For example, the reflective light interference caused by topography on a semiconductor substrate affects the pattern dimension greatly in case of exposure with a mercury light. When there is a protrusion and a depression or a topography on a substrate, light entering can cause a diffused reflection at an area with different levels generating a halation phenomena, resulting in pattern flow. Consequently, an excellent resist pattern is not formed.

Additionally, as the thickness of the resist layer is different at upper and lower parts of the substrate, the light interference conditions in a resist layer vary causing pattern dimension changes. Furthermore, when exposing with excimer laser light, the ratio of a minute pattern height and width can not be controlled as the proximity effect is generated by the rear dispersion of electrons.

A multilayer resist system using a spin-on-glass coating was suggested (Japanese Laid-open Patent No. Heisei 3-203240) as a method for resolving these problems caused by protrusions and depressions of a substrate surface. A multilayer resist system is a method in which a thick first organic resist layer having high absorbance is coated over the entire surface of the substrate so that protrusions, depressions and topography are planarized. A thin second resist pattern is formed on the first organic resist layer using commonly known photolithography techniques, and this resist pattern is transferred to the above thick first organic resist layer so that an exposed area of the above substrate can be etched. Although the thick first organic resist layer can be directly etched using the above second resist pattern as a mask, it is also good to etch an exposed part of the first organic resist layer using a SOG coating as a mask after a middle layer, such as highly etched resistant spin-on-glass, is formed between both layers, and unnecessary parts of this SOG middle layer are removed. As in the multilayer resist system, protrusions, depressions and topography on the substrate surface were planarized by the first organic resist layer having high absorbance, and a light, which passes from the top through the second resist film formed on the first organic resist layer, is absorbed by the first organic resist layer. Therefore, halation caused by reflection and dispersion of light from the substrate surface, or light interference in the resist film can be reduced, thereby preventing pattern shape dispersion or dimension change.

This method using a multilayer resist system has an advantage in that a high degree of applications are possible with the photolithography as the first resist layer controls the resist pattern characteristics as a mask, and the second resist layer, required for photosensitivity and resolution, can be bonded freely.

For example, this method can be easily applied to extreme ultraviolet photolithography in which an extreme ultraviolet excimer laser light as an excimer light source is employed by using the first resist layer having excellent dry etching resistance and the second photosensitive resist having the high sensitivity and resolution with an extreme ultraviolet excimer laser light with a wavelength of less than 300 nm.

Therefore, the thinner composition can be used in washing and removing undesired coating on the edges and backside of the substrate through such processes as the coating of an SOG solution in order to form an intermediate insulated layer in the semiconductor multi-layer wiring process, to improve layer flatness, in the process of coating the middle layer SOG solution for a multilayer resist system, or in the process of coating each photoresist that is used as a mask in the photolithography.

A dissolution rate and volatility may decide the performance of the above thinner composition.

A thinner composition dissolution rate, as a capability of how effectively and quickly spin-on-glass and photoresist can be dissolved and removed, is crucial.

Particularly, a smoothly treated profile like that shown in FIG. 2 can be made only by a proper dissolution rate in case of an edge area rinsing. When the dissolution rate is too high, a photoresist attack can appear in the rinsing of a photoresist which is coated on a substrate as shown in FIG. 3. When the dissolution rate is too low, a flow phenomena of the partially dissolved photoresist tailings in the rinsing of a coated photoresist on the substrate can occur as shown in FIG. 4. As integrated semiconductor circuits are moving toward higher integration and densities, a low rotation speed is now essential during the rinsing process with larger caliber rotational coaters. However, during the rinse process, whenever the substrate is shaken during a slow speed spin and the proper dissolution rate is not maintained for the sprayed liquid contact speed, then a bounding phenomenon and the increased use of excess fluid can occur. A stronger dissolution rate of thinner is required in the low rpm rinsing process due to the diameter size which is larger than the conventional high rpm rinsing process.

Furthermore, volatility is required so that a thinner is easily evaporated in order that it does not remain on a substrate after the spin-on-glass coating and photoresist are removed. When the volatility is too low such that a thinner can not be evaporated, the remaining thinner itself serves as a contamination source in the each of the later processes, particularly in the subsequent etching process, etc. On the other hand, when the volatility is too high, the substrate is too rapidly cooled so that the variations in film thickness of the spin-coated spin-on-glass and photoresist are increased. Furthermore, easy volatility even during handling can result in contaminating the clean room itself. This in itself causes a variety of faults, such as tailings or photoresist attack, and becomes a direct source for a decrease in semiconductor component manufacturing productivity.

The conventional thinner compositions will now be described.

A method for removing unnecessary photoresist by contact with a thinner in the areas of edge upside parts, edge side parts, and edge backside parts is diclosed in Laid-open Japanese Patent No. Showa 63-69563. For example, the solvents for washing and removing photoresist include ether and ether acetate groups such as cellosolve, cellosolve acetate, propyleneglycol ether, propyleneglycol ether acetate, etc; ketone groups such as acetone, methylethyl ketone, methylisobutylketone, cyclohexanone, etc; and ester groups such as methyl lactate, ethyl lactate, methyl acetate, ethyl acetate, butyl acetate, etc. Propyleneglycol monomethylether Acetate (PGMEA) is used as a thinner in Laid-open Japanese Patent No. Heisei 4-49938, and a method using alkylalkoxy propionate as a thinner, etc., is disclosed in Laid-open Japanese Patent No. Heisei 4-42523.

However, although these conventional thinner solvents use a single solvent such as ethylene glycol monoethyl ether acetate (EGMEA), propylene glycol monomethyl ether acetate (PGMEA), and ethyl lactate (EL), there is a problem as it has the following limitations.

That is, although ethylene glycol monoethyl ether acetate is excellent in terms of its dissolution rate, there are problems in that its volatility and flammability are high, and it is particularly toxic and associated with leukopenia and stillborn problems. Propylene glycol monomethyl ether acetate contains β type of materials from its manufacturing processes, and has toxicity problems that may cause birth defects and otherwise be problematic to pregnant mothers. Ethyl lactate can not obtain a sufficient rinsing effect by itself due to its high viscosity and low dissolution rate, and acetone, methylethylketone, etc., have problems of low workability due to their low flash point.

Methods in which the conventional single solvents are mixed were developed in order to resolve these problems the methods and are described below.

A mixed solvent composed of a pyruvic acid alkyl based solvent and methyl ethyl ketone was used as a thinner in Japanese Laid-open Patent No. Heisei 4-130715. A thinner composition composed of a mixture of propylene glycol alkylether and a 3-alkoxypropionic acid alkyl group was used in Japanese Laid-open Patent No. Heisei 7-146562. Additionally, a thinner composed of a mixture of propylene glycol alkylether and butyl acetate, and ethyl lactate, or a mixture of butyl acetate, ethyl lactate, and propylene glycol alkylether acetate was used in Japanese Laid-open Patent No. Heisei 7-128867. A thinner composed of a mixture of propylene glycol alkylether propionate, and methylethyl ketone, or a mixture composed of propylene glycol alkylether propionate, and acetic butyl ester/butyl acetate was used in Japanes Laid-open Patent No. Heisei 7-160008. Also, a mixed solvent composed of propylene glycol alkylether acetate, and propylene glycol alkylether was used as a thinner in U.S. Pat. No. 4,983,490, and a mixture composed of ethyl lactate and methyl ethyl ketone was used as a thinner in U.S. Pat. No. 4,886,728.

However, there have been many problems when the above described mixed solvents are applied to the semiconductor component manufacturing process, especially considering the ever-increasing with high integration and large sized diameters.

For example, a mixed solvent composed of a pyruvic acid alkyl based solvent and methyl ethyl ketone cannot easily dissolve a 1,2-naphthoquinonediazide based photosensitizer (having a high esterification ratio among photosensitizer, and being a main constituent of photoresists). Also using a high volatility solvent such as a mixed solvent composed of propyleneglycol alkyl ether propionate and butyl acetate for rinsing the backside of the substrate cools the substrate and verifies a thickness of photoresist, and using a low volatility solvent such as a mixed solvent composed of ethyl lactate and methyl ethyl ketone reduces the rinsing capability on the substrate edge area. Particularly, solvents such as methyl pyruvate, ethyl pyruvate, etc., are known to corrode metal parts in the used photoresist reservoir fixed to a photoresist spin-coater after prolonged use.

As to the characteristics of the solvents in use, although propylene glycol monomethyl ether is known to have an advantage that increases the photosensitivity of photoresist compared to the conventional ethylene glycol monoethyl ether, i.e., a higher dissolution on photoactive compounds, it can cause discomfort to people due to its bad odor and somatological concerns. Although there was an attempt to mix this with propylene glycol monomethyl ether acetate as a method to mitigate these problems (U.S. Pat. No. 4,983, 490), the problems nevertheless remain.

SUMMARY OF THE INVENTION

It is an object of the present invention to provide a thinner composition in which processes are simplified by using a single thinner composition from among the various types of photoresist compositions spanning the long wavelength range of photoresist compositions to the short wavelength range of photoresist composition used with excimer laser to achieve minuteness, and high integration. The most desirable effects are obtained in removing an undesired coating at the edges and a backside of a substrate which is produced in the spin-on-glass spin-coating processes that are used for integrated circuit component multilayerization such as applying an intermediate layer, planarizing sublayer, or a middle layer of a multi-layer resist system.

It is another object of the present invention to provide a thinner composition that has an excellent dissolution rate and volatility for a spin-on-glass and applications of the short-wavelength excimer laser.

It is yet another object of the present invention to provide a thinner composition for washing and removing in the semiconductor component manufacturing process, in which a smoothly treated profile can be obtained by removing the above spin-on-glass and photoresist composition effectively by spraying it through a nozzle.

It is still another object of the present invention to provide a thinner composition having a high working stability and a low degree of corrosion due to its being free of substances that are toxic to humans as well as free of an unpleasant odor.

For the thinner composition for washing and resist removal of the semiconductor component manufacturing process to achieve the above objects, the present invention provides a mixed thinner composition in which propyleneglycol monoalkylether is mixed with monooxycarbonicacid ester, alkyl ethanoate, and alkyl lactate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, wherein.

DETAILED DESCRIPTION OF THE PREFERRED EMBODIMENTS

Figure 1:
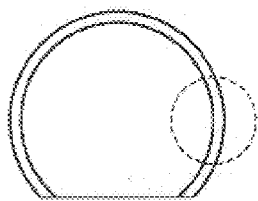
FIG. 1 is a plan view showing a substrate that has been spin covered with a coating liquid.
Figure 2:
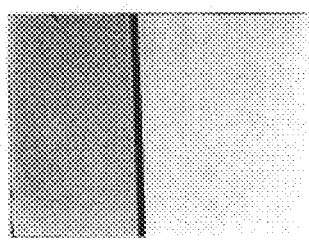
FIG. 2 is an enlarged scanning electron microscope (SEM) photograph of a substrate edge area (inside the dotted line area of FIG. 1) taken after the coated substrate has been rinsed cleanly.
Figure 3:
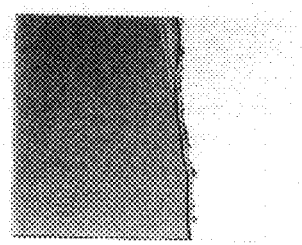
FIG. 3 is an enlarged scanning electron microscope (SEM) photograph of a substrate edge area (inside the dotted line area of FIG. 1) showing the photoresist attack phenomena which can result from a washing and removing procedure of the coated substrate.
Figure 4:
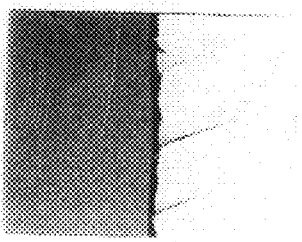
FIG. 4 is an enlarged scanning electron microscope (SEM) photograph of a substrate edge area (inside the dotted line area of FIG. 1) showing the photoresist tailing phenomenon which can result from a washing and removing procedure of the coated substrate.
Figure 5:
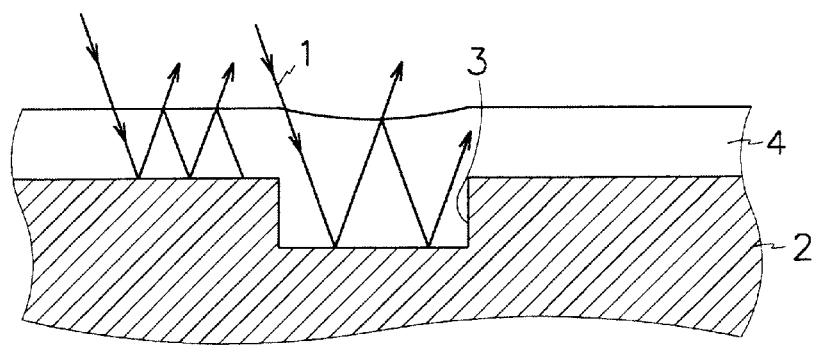
FIG. 5 is a sectional view showing a multiple reflective effect of a photoresist coated substrate where 1 represents irradiating light, 2 represents a substrate, 3 represents a level difference, and 4 represents photoresist.
Figure 6:
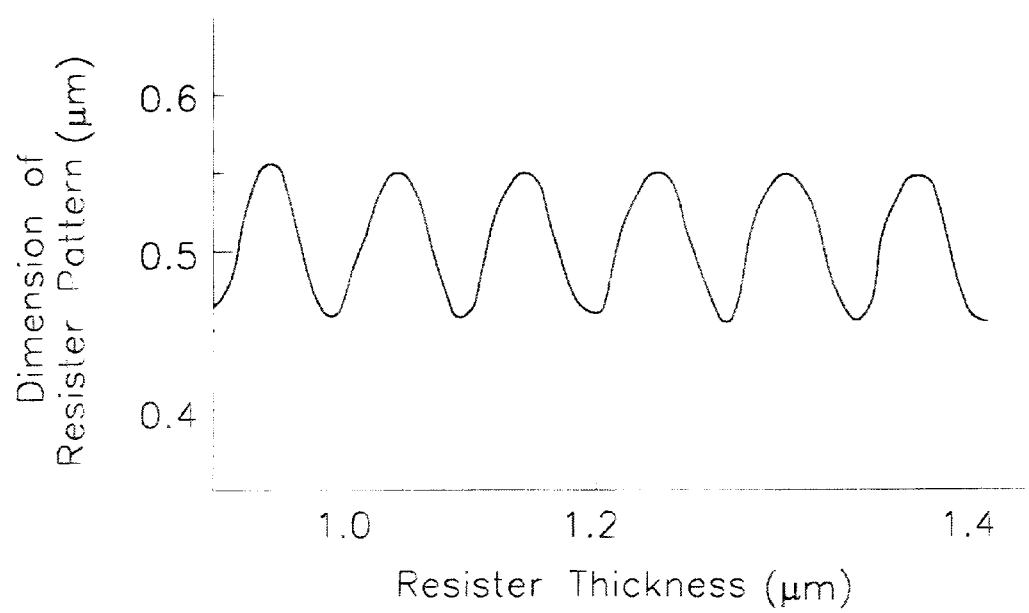
FIG. 6 shows the dimensional change of a pattern by the variation of the photoresist film thickness.
Figure 7:
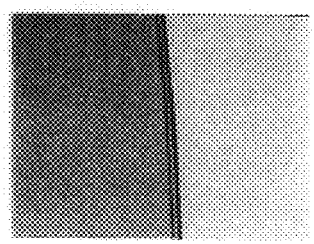
FIG. 7 is a scanning electron microscope (SEM) photograph of an edge after the Edge Bead Removal test on a photoresist A with a thinner composition of EXAMPLE 1 indicated in Table 8.

In the following detailed description, only the preferred embodiment of the invention has been shown and described, simply by way of illustration of the best mode contemplated by the inventors of carrying out the invention. As will be realized, the invention is capable of modification in various obvious respects, all without departing from the invention. Accordingly, the drawings and description are to be regarded as illustrative in nature, and not restrictive.

The present invention provides a thinner composition for washing and removing in semiconductor component manufacturing processes, in which the composition is a mixture comprised of propylene glycol monoalkyl ether, monooxycarbonic acid ester, alkyl ethanoate, and alkyl lactate.

Preferably, propylene glycol monoalkyl ether of 40 to 80 wt % are mixed with monooxycarbonic acid ester of 10 to 30 wt %, and alkyl ethanoate of 1 to 20 wt % or alkyl lactate of 1 to 20 wt %.

Based on experimentation, it has been determined that the present invention can display excellent performance as a thinner composition for rinsing and resist removal when the above four constituents are properly combined with a specific constituent ratio.

In a composition of the present invention, all of the above propylene glycol monoalkyl ether, monooxycarbonic acid ester, alkyl ethanoate, and alkyl lactate to be used are selected from an ultra pure semiconductor-grade of products, and the thinner composition is filtered with a 0.1 μm filter for very large scale integration (VLSI) device fabrication.

Propylene glycol monoalkyl ether having an alkyl group with 1 to 5 carbon atoms in the above thinner composition can be used, including propyleneglycol monomethylether, propyleneglycol monoethylether, propyleneglycol monopropylether, propyleneglycol monobutylether, etc. Propyleneglycol monomethylether, from among these, has the most excellent dissolution on siloxane polymer, which is a SOG main constituent.

Monooxycarbonic acid ester is one constituent of the above composition, in which alkyl and alkoxy groups with 1 to 5 carbon atoms can be used. These compounds include 3-methoxypropionic acid methyl ester, 3-ethoxypropionic acid ethyl ester, 3-methoxypropionic acid ethyl ester, 3-ethoxypropionic acid methyl ester, 2-methoxyacetic acid methyl ester, 2-ethoxyacetic acid ethyl ester, 2-hydroxypropionicacid methyl ester, 2-hydroxypropionicacid ethyl ester, 2-hydroxypropionic acid propyl ester, 2-methoxypropionic acid ethyl ester, 2-ethoxypropionic acid propyl ester, 2-ethoxypropionic acid ethyl ester, β-methoxyisobutyric acid methyl ester, α-hydroxyisobutyric acid methyl ester, etc. 3-ethoxy propionic acid ethyl ester, from among these, is preferred in terms of its dissolution on a binder phenol resin.

Alkyl ethanoate, commonly called an alkyl acetate, is another constituent of the above composition in which an alkyl group with 1 to 4 carbon atoms can be used. These compounds include methyl ethanoate, ethyl alkyl ethanoate, butyl ethanoate, etc. Butyl ethanoate, from among these, is the most preferred in terms of the dissolution on a polyvinyl phenol resin, which is a binder resin of a excimer laser photoresist.

Alkyl lactate is another constituent of the present invention composition, in which an alkyl group with 1 to 4 carbon atoms can be used. These compounds include methyl lactate, ethyl lactate, butyl lactate, etc. Ethyl lactate, from among these, is the most excellent in terms of the dissolution on a photoactive compound of a photoresist.

On the other hand, when the characteristics of solvent to be used are reviewed, it can be confirmed that a solvent mixed with monooxy carbonic acid ester, a constituent of the present invention composition, is free of an unpleasant odor and toxic effects on humans, and a dissolution performance on a photoresist also causes a synergistic effect.

It has been determined that propyleneglycol monomethylether is safer for humans during airborne exposure and is safer in the metabolism as it is rapidly decomposed into propyleneglycol and alcohol. In toxicological tests, a 50% oral lethal dose to a mouse is represented as $LD_{50}$(mouse)= 4.4 g/kg, and it is rapidly decomposed by hydrolysis. Physical properties include a boiling point of 132.8° C., a flash point (measured in the closed cup method) of 32° C., a viscosity (at 25° C.) of 1.86 centipoises (cps), a surface tension of 26.5 dyne/cm$^2$, and a solubility parameter of 10.4.

The conventional thinner using ethylene glycol monoalkyl ether acetate only generates an unpleasant odor after use on spin-coater, and causes an unpleasant feeling (as it is known that if the thinner is used for a long time, fatigue is easily felt and the thinner negatively affects respiratory organs due to the fragrant property of volatile solvent). However a mixture solvent with monooxycarbonic acid ester can mitigate discomfort caused by an objectionable odor. Monooxycarbonic acid ester can even be used, for example, as a fragrance. Additionally, monooxycarbonic acid ester has excellent dissolution properties on a polymer binder phenol resin among the photoresist represented in the below Table 1. These have 2 to 10 times better dissolution rates than the conventionally used ethyleneglycol monoalkylether acetate only.

The above monooxycarbonic acid ester, which exists as a liquid phase at room temperature, and is used as an intermediate in vitamins or other chemical materials, is not reportedly to have particular toxic effects on a humans. It shows a $LD_{50}$ (mouse)=5.0 g/kg in a toxicity test that represents 50% of a oral lethal dose to a mouse and it is rapidly decomposed by enzyme activity. Physical properties include 0.95 g/cm³ of density, a boiling point of 170.1° C., flash point of 82.2° C. (measured in an open cup method), viscosity of 1.20 centipoises (at 25° C.), and surface tension of 27 dyne/cm².

Butyl ethanoate has an excellent dissolution rate on a variety of resins, and particularly low surface tension, as well as an excellent volatility such that excellent interfacial characteristics are achieved when a small amount of it is added to a thinner composition. Additionally, it can be seen in Table 1 that it has an excellent dissolution rate on polyvinyl phenol derivatives, a binder resin of short wavelength excimer laser photoresist composition and a siloxane oligomer solution, a main constituent of spin-on-glass.

Butyl ethanoate shows a $LD_{50}$ (mouse)=7.0 g/kg in a toxicological test that represents 50% of a oral lethal dose to a mouse. Physical properties include a boiling point of 126.1° C., flash point of 23° C. (measured in a closed cup method), viscosity of 0.74 centipoises (at 25° C.), surface tension of 25 dyne/cm², and a solubility parameter of 8.5.

Ethyl lactate has higher a solubility on photoactive compounds of photoresist than other solvents. However, it is difficult for ethyl lactate to be used as an independent thinner composition due to its high surface tension and viscosity, and a small amount, less than 1 wt % of the total thinner composition, can produce excellent characteristics when mixed with other thinners.

Ethyl lactate, which is acknowledged as safe by the U.S. Food and Drug Administration, is currently used as a food additive. It shows $LD_{50}$ (mouse)=5.0 g/kg in a toxicological test that represents 50% of a oral lethal dose of a mouse and it is metabolically safe as it is rapidly decomposed into lactic acid and ethanol. Physical properties include a boiling point of 156° C., flash point of 52° C. (measured in a closed cup method), viscosity of 2.38 centipoises (at 25° C.), surface tension of 34 dyne/cm², and a solubility parameter of 10.

The present invention is applied by first properly combining the above four compositions with a certain constituent ratio, after which the above mentioned varieties of photoresist and spin-on-glass are coated by a spin-coater, and unnecessary edge beads are removed by dropping or spraying through a nozzle the thinner compositions on substrate edges and the backside thereof. The supply quantity of a thinner composition can be adjusted according to the type of photoresist resins and spin-on-glass, film thickness, with the proper quantity generally selected from the range of 5 to 100 cc/min. After that, the substrate is dried through a spin dry process, and the micro pattern for semiconductor ICs can be completed through the subsequent photolithography process.

[Solubility Comparison Test]

Comparison ratios are presented in Table 1, with the solvent having the best solubility being regarded as 100% in order to find the solubility of saturated solutions made with various solvents on polymer binder phenol resin, polyvinylphenol resin, photoactive compounds, and siloxane polymer solution. It can be confirmed that when the test results are reviewed, specific solvents have excellent dissolution capabilities on specific constituents. That is, it can be seen that 3-ethoxypropionic acid ethyl ester has the most excellent dissolution capability on a polymer binder phenol resin, butyl ethanoate works well on polyvinylphenol resin, ethyl lactate is best on photoactive compounds, and propylene glycol monomethyl ether has the best dissolution capability on a siloxane polymer solution.

TABLE 1

Dissolution performance comparison of a spin-on-glass (SOG) and photoresist

| Classification | EGMEA | PGME | EPE | MBM | PGMEP | BE | EP | EL | MEK |
| --- | --- | --- | --- | --- | --- | --- | --- | --- | --- |
| Binder Phenol resin | 50 | 76 | 100 | 94 | 57 | 64 | 42 | 35 | 40 |
| Polyvinyl phenol resin | 23 | 67 | 89 | 82 | 21 | 100 | 27 | 56 | 43 |
| Photosensitive photo-active compounds | 10 | 46 | 39 | 33 | 16 | 56 | 8 | 100 | 20 |
| Siloxane polymer solution | 15 | 100 | 85 | 74 | 36 | 91 | 32 | 47 | 24 |

In the above Table 1, EGMEA represents ethylene glycol monoethyl ether acetate, PGME represents propylene glycol monomethyl ether, EPE represents 3-ethoxypropionic acid ethyl ester, MBM represents β-methoxyisobutyric acid methyl ester, PGMEP represents propylene glycol monomethyl ether propionate, BE represents butyl ethanoate, EP represents ethyl pyruvate, EL represents ethyl lactate, and MEK represents methyl ethyl ketone.

EXAMPLE PREPARATIONS

Substrates used in the present examples were prepared as follows. Silicon oxide substrates having a diameter of 8 inches were used. These substrates were first rinsed in two baths respectively containing a hydrogen peroxide and sulfuric acid mixture (the substrates were dipped into each bath for 5 minutes), and washed with deionized water. This procedure was carried out in made-to-order washing equipment. After that, these substrates were spin dried in a spin drier (a product of VERTEQ Company, Model No. SRD 1800-6), and then photoresist was coated to a predetermined thickness on each of the substrate surfaces. A spin-coater (a product of Dainippon Screen Company, Model No. 80A) was used to coat photoresist.

In the above spin-coater operation, 7 cc of photoresist was dropped on the center of a suspended substrate, and photoresist was spread using the spin-coater at a speed of 500 rpm for 3 seconds. The substrate was then accelerated to a spin-speed of around 2000 to 4000 rpm adjusting the thickness of the photoresist to a predetermined level. The rotation time was about 20 to 30 seconds at this speed.

EXAMPLES 1 TO 4, AND COMPARATIVE EXAMPLES 1 TO 3

Dissolving Speed Measurement Test of a Thinner Composition on a Photoresist

The dissolving speed was measured using thinner compositions represented in Table 3 and conventional thinner compositions represented in Table 2 [G-line positive photoreist (a product of Dong Jin Chemical Ind. Co., Ltd., Product Name DSAM-300), I-line positive photoresist (a product of Dong Jin Chemical Ind. Co., Ltd., Product Name DPR-i5500), and Deep UV positive photoresist (a product of Dong Jin Chemical Ind. Co., Ltd., Product Name DHRK-200L)] that were selected from among photosensitive resin compositions commercially available. A resist development analyzer (a product of Litho Tech Company, Model No. RDA-790) was used as a measuring unit, and the test results are represented in Table 4.

TABLE 2

Type and film thickness of a photoreist

| Classification | Composition type | Composition product name | Film thickness ($\mu$m) |
|---|---|---|---|
| Photoresist A | G - line positive type | DSAM-300 | 1.3 |
| Photoresist B | I - line positive type | DPR-i5500 | 1.2 |
| Photoresist C | Deep UV positive type | DHRK-200L | 0.9 |

TABLE 3

Thinner compositions

| Classification | EXAMPLE 1 | EXAMPLE 2 | EXAMPLE 3 | EXAMPLE 4 | COM. EXAMPLE 1 | COM. EXAMPLE 2 | COM. EXAMPLE 3 |
|---|---|---|---|---|---|---|---|
| Composition (wt %) | PGME 80 EPE 10 BE 5 EL 5 | PGME 70 EPE 10 BE 10 EL 10 | PGME 75 MBM 15 BE 8 EL 2 | PGME 60 MBM 30 BE 9 EL 1 | PGMEP 60 PGMEA 40 | PGME 50 EL 50 | PGME 70 PGMEA 30 |

In the above Table 3, PGME represents propylene glycol monomethyl ether, EPE represents 3-ethoxypropionic acid ethyl ester, MBM represents $\beta$-methoxyisobutyric acid methyl ester, PGMEP represents propylene glycol monomethyl ether propionate, PGMEA represents propylene glycol monomethyl ether acetate, BE represents butyl ethanoate, EL represents ethyl lactate, and BL represents butyl lactate.

The above thinner compositions can also be used for the purpose of recycling substrates by removing photoresists adhered to the surfaces of defected substrates from the photolithography process, or substrates that were randomly drawn out for process control testing. The thinner compositions according to the present invention have excellent dissolution rates so that the process time can be shortened for substrate recycling.

Excess Photoresist Removal Test of a Thinner Composition on a Photoresist

After all the photoresist was coated on 8-inch silicon oxide substrates, a test for removing excess edge photoresist with a thinner composition according to the present invention and conventional thinner compositions (or the Edge Bead Removal test: hereinafter referred to as the EBR test) was made. The Edge Bead Removal test also used the same spin-coater as had been used in the coating of photoresist.

The removal operation of edge photoresist was made under the conditions of Table 6 by supplying a thinner composition represented in Table 3 via an EBR nozzle onto a photoresist coated substrate represented in Table 5. All thinners were supplied from a gauge mounted pressurized vessel, the pressure was 1.0 kgf, and the flow rate of thinner from the EBR nozzle was 12 cc/min.

TABLE 4

Dissolution rate of a thinner composition on a photoresist composition

| Classification | EXAMPLE 1 | EXAMPLE 2 | EXAMPLE 3 | EXAMPLE 4 | COM. EXAMPLE 1 | COM. EXAMPLE 2 | COM. EXAMPLE 3 |
|---|---|---|---|---|---|---|---|
| Dissolution rate on photoresist A (Å/sec) | 3369.27 | 3255.21 | 3591.95 | 3342.25 | 2894.06 | 2571.62 | 3034.07 |
| Dissolution rate on photoresist B (Å/sec) | 6232.60 | 6167.74 | 6607.14 | 6419.23 | 5767.74 | 4711.50 | 5879.31 |
| Dissolution rate on photoresist C (Å/sec) | 11043.96 | 10468.75 | 11043.96 | 11043.96 | 9081.13 | 8754.05 | 9150.50 |

As shown in Table 4, a thinner composition dissolution rate according to the present invention was faster than the conventional thinner compositions regardless of the photoresist type to which it was applied.

The EBR test results on each of the photoresists are represented in Table 7, and the edges after the Edge Bead Removal are shown as scanning electronic microscope photos that are cataloged in Table 8.

TABLE 5

Type and coating thickness of a photoresist

| Classification | Composition type | Composition product name | Film thickness (μm) |
|---|---|---|---|
| Photoresist A | G - line positive type | DSAM-300 | 1.3 |
| Photoresist B | I - line positive type | DPR-i5500 | 1.2 |
| Photoresist C | deep UV positive type | DHRK-200L | 0.9 |
| Photoresist D | deep UV negative type | DHRK-N100 | 0.9 |

TABLE 6

Edge Bead Removal (EBR) test conditions

| Classification | Rotation speed (rpm) | Time (sec) |
|---|---|---|
| Dispensing condition | 500 | 3 |
| Spin coating | adjusted according to photoresist thickness | |
| EBR condition | 2000 | 6 |
| Drying condition | 2500 | 3 |

TABLE 7

Edge Bead Removal (EBR) test evaluation on photoresist

| Classification | EXAMPLE 1 | EXAMPLE 2 | EXAMPLE 3 | EXAMPLE 4 | COM. EXAMPLE 1 | COM. EXAMPLE 2 | COM. EXAMPLE 3 |
|---|---|---|---|---|---|---|---|
| EBR test results on photoresist A | O | O | Δ | O | Δ | O | O |
| EBR test results on photoresist B | O | O | O | O | Δ | X | Δ |
| EBR test results on photoresist C | Δ | O | O | O | X | X | X |
| EBR test results on photoresist D | O | O | O | O | O | Δ | O |

An evaluation mark O indicates a clear edge shape after the EBR, an evaluation mark Δ indicates a distorted edge shape after the EBR caused by photoresist attack, and X indicates the tailing phenomena of the edge film after the EBR.

TABLE 8

Edge observation results after Edge Bead Removal test on various types of photoreists

Figure 8:
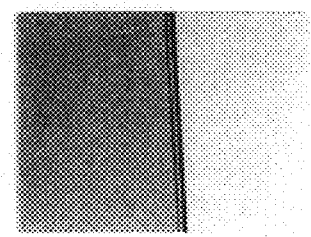
FIG. 8 is a scanning electron microscope (SEM) photograph of an edge after the Edge Bead Removal test on a photoresist A with a thinner composition of the EXAMPLE 2 indicated in Table 8.
Figure 9:
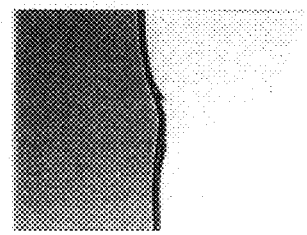
FIG. 9 is a scanning electron microscope (SEM) photograph of an edge after the Edge Bead Removal test on a photoresist A with a thinner composition of COMPARATIVE EXAMPLE 1 indicated in Table 8.
Figure 10:
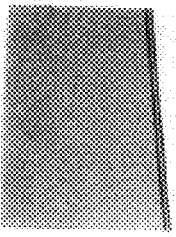
FIG. 10 is a scanning electron microscope (SEM) photograph of an edge after the Edge Bead Removal test on a photosensitive resin A with a thinner composition of COMPARATIVE EXAMPLE 2 indicated in Table 8.
Figure 11:
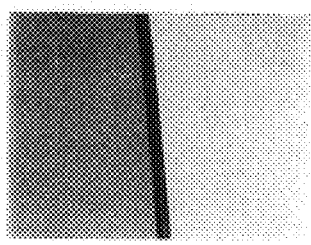
FIG. 11 is a scanning electron microscope (SEM) photograph of an edge after the Edge Bead Removal test on a photosensitive resin B with a thinner composition of EXAMPLE 1 indicated in Table 8.
Figure 12:
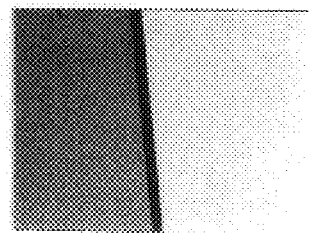
FIG. 12 is a scanning electron microscope (SEM) photograph of an edge after the Edge Bead Removal test on a photosensitive resin B with a thinner composition of EXAMPLE 2 indicated in Table 8.
Figure 13:
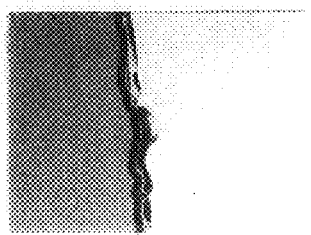
FIG. 13 is a scanning electron microscope (SEM) photograph of an edge after the Edge Bead Removal test on a photosensitive resin B with a thinner composition of COMPARATIVE EXAMPLE 1 indicated in Table 8.
Figure 14:
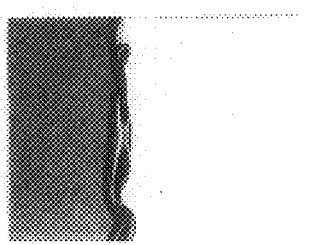
FIG. 14 is a scanning electron microscope (SEM) photograph of an edge after the Edge Bead Removal test on a photosensitive resin B with a thinner composition of COMPARATIVE EXAMPLE 2 indicated in Table 8.
Figure 15:
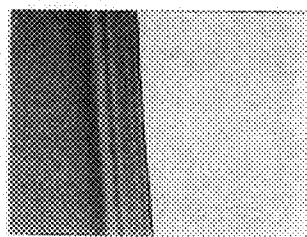
FIG. 15 is a scanning electron microscope (SEM) photograph of an edge after the Edge Bead Removal test on a photosensitive resin C with a thinner composition of EXAMPLE 1 indicated in Table 8.
Figure 16:
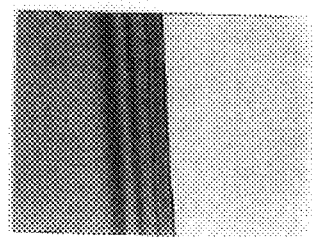
FIG. 16 is a scanning electron microscope (SEM) photograph of an edge after the Edge Bead Removal test on a photosensitive resin C with a thinner composition of EXAMPLE 2 indicated in Table 8.
Figure 17:
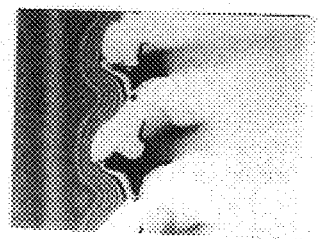
FIG. 17 is a scanning electron microscope (SEM) photograph of an edge after the Edge Bead Removal test on a photosensitive resin C with a thinner composition of COMPARATIVE EXAMPLE 1 indicated in Table 8.
Figure 18:
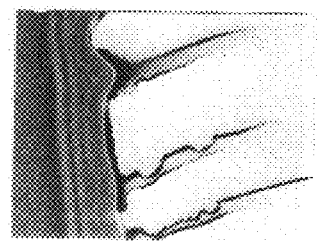
FIG. 18 is a scanning electron microscope (SEM) photograph of an edge after the Edge Bead Removal test on a photosensitive resin C with a thinner composition of COMPARATIVE EXAMPLE 2 indicated in Table 8.
Figure 19:
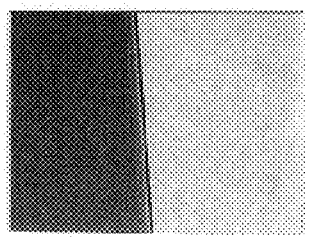
FIG. 19 is a scanning electron microscope (SEM) photograph of an edge after the Edge Bead Removal test on a photosensitive resin D with a thinner composition of EXAMPLE 1 indicated in Table 8.
Figure 20:
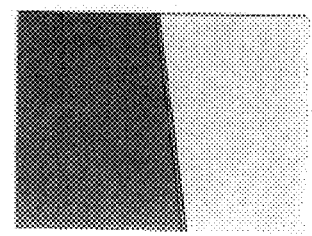
FIG. 20 is a scanning electron microscope (SEM) photograph of an edge after the Edge Bead Removal test on a photosensitive resin D with a thinner composition of EXAMPLE 2 indicated in Table 8.
Figure 21:
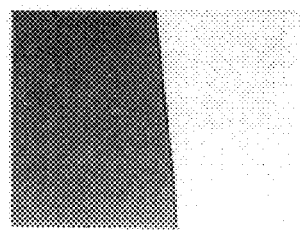
FIG. 21 is a scanning electron microscope (SEM) photograph of an edge after the Edge Bead Removal test on a photosensitive resin D with a thinner composition of COMPARATIVE EXAMPLE 1 indicated in Table 8.
Figure 22:
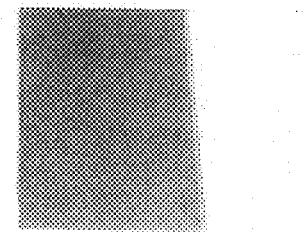
FIG. 22 is a scanning electron microscope (SEM) photograph of an edge after the Edge Bead Removal test on a photosensitive resin D with a thinner composition of COMPARATIVE EXAMPLE 2 indicated in Table 8.

| Classification | EXAMPLE 1 | EXAMPLE 2 | COMPARATIVE EXAMPLE 1 | COMPARATIVE EXAMPLE 2 |
|---|---|---|---|---|
| SEM observation after EBR test on photoreist A | FIG. 1 | FIG. 8 | FIG. 9 | FIG. 10 |
| SEM observation after EBR test on photoresist B | FIG. 11 | FIG. 12 | FIG. 13 | FIG. 14 |
| SEM observation after EBR test on photoresist C | FIG. 15 | FIG. 16 | FIG. 17 | FIG. 18 |
| SEM observation after EBR test on photoresist D | FIG. 19 | FIG. 20 | FIG. 21 | FIG. 22 |

As indicated by the data of Table 7 and Table 8, the thinner compositions according to the present invention all show excellent performances (i.e., clear-cut edge shapes), while the conventional two constituent based thinner compositions show remarkable variation of results depending on photoresists, and reveal defected edge shapes on the whole. Particularly, the conventional two constituent based thinner compositions on a Deep UV positive photoresist can not prevent the severe occurrence of a tailing phenomena. This causes equipment contamination, etc., in the subsequent process, leading to reduced productivity in the semiconductor component manufacturing.

EXAMPLE 5

After the above photoresists were coated on 8-inch silicon oxide substrates, edge photoresist removal tests were taken on the thinner compositions of EXAMPLES 1 and 2, and the conventional COMPARATIVE EXAMPLES 1 and 3 varying an EBR spin speed from a low speed rpm to a high speed rpm under the conditions of Table 9.

Making visual observations, low EBR spin speed (1200 rpm) results were written in Table 10, and high EBR spin speed (2800 rpm) results were written in Table 11.

Further, SEM photo comparisons at a low EBR spin speed (1200 rpm) are presented in Table 12, and SEM photo comparisons at a high EBR spin speed (2800 rpm) are presented in Table 13.

TABLE 9

Edge Bead Removal (EBR) Test Conditions

| Classification | Spin speed (rpm) | Time (sec) |
|---|---|---|
| Dispensing condition | 500 | 3 |
| Spin coating | Adjusted according to photoresist thickness | |
| EBR condition | Low rpm: 1200 high rpm: 2800 | 6 |
| Drying condition | 2500 | 3 |

TABLE 10

Low Spin Speed (1200 rpm) change Edge Bead Removal (EBR) test evaluation of thinner compositions

| Classification | EXAMPLE 1 | EXAMPLE 2 | COMPARATIVE EXAMPLE 1 | COMPARATIVE EXAMPLE 3 |
|---|---|---|---|---|
| Composition (wt %) | PGME 80 EPE 10 BE 5 EL 5 | PGME 70 EPE 10 BE 10 EL 10 | PGMEP 60 PGMEA 40 | PGME 70 PGMEA 30 |
| EBR test results on photoresist A | Δ | 0 | 0 | 0 |

TABLE 10-continued

Low Spin Speed (1200 rpm) change Edge Bead Removal (EBR) test evaluation of thinner compositions

| Classification | EXAMPLE 1 | EXAMPLE 2 | COMPARATIVE EXAMPLE 1 | COMPARATIVE EXAMPLE 3 |
|---|---|---|---|---|
| EBR test results on photoresist B | 0 | 0 | Δ | Δ |
| EBR test results on photoresist C | 0 | 0 | X | X |
| EBR test results on photoresist D | 0 | 0 | Δ | 0 |

TABLE 11

High Spin Speed (2800 rpm) change Edge Bead Removal (EBR) test evaluation of thinner compositions

| Classification | EXAMPLE 1 | EXAMPLE 2 | COMPARATIVE EXAMPLE 1 | COMPARATIVE EXAMPLE 3 |
|---|---|---|---|---|
| Composition (wt %) | PGME 80 EPE 10 BE 5 EL 5 | PGME 70 EPE 10 BE 10 EL 10 | PGMEP 60 PGMEA 40 | PGME 70 PGMEA 30 |
| EBR test results on photoresist A | 0 | 0 | Δ | 0 |
| EBR test results on photoresist B | 0 | 0 | X | Δ |
| EBR test results on photoresist C | Δ | 0 | X | X |
| EBR test results on photoresist D | 0 | 0 | Δ | 0 |

In the above Tables 10 and 11, an evaluation mark O indicates a clear edge shape after the EBR, an evaluation mark Δ indicates a distorted edge shape after the EBR caused by photoresist attack, and X indicates the tailing phenomena of an edge part after the EBR.

TABLE 12

Edge observation results during the Low Spin Speed (1200 rpm) change Edge Bead Removal (EBR) test evaluation of thinner compositions

Figure 23:
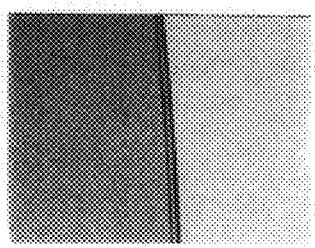
FIG. 23 is a scanning electron microscope (SEM) photograph of an edge after the Edge Bead Removal test on a photosensitive resin A with a thinner composition of EXAMPLE 1 indicated in Table 12.
Figure 24:
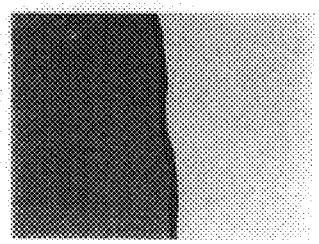
FIG. 24 is a scanning electron microscope (SEM) photograph of an edge after the Edge Bead Removal test on a photosensitive resin A with a thinner composition of EXAMPLE 2 indicated in Table 12.
Figure 25:
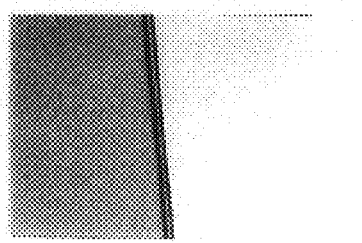
FIG. 25 is a scanning electron microscope (SEM) photograph of an edge after the Edge Bead Removal test on a photosensitive resin A with a thinner composition of COMPARATIVE EXAMPLE 1 indicated in Table 12.
Figure 26:
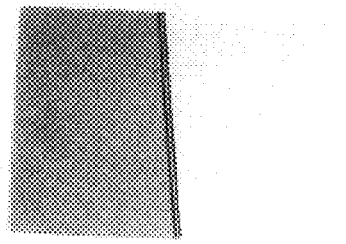
FIG. 26 is a scanning electron microscope (SEM) photograph of an edge after the Edge Bead Removal test on a photosensitive resin A with a thinner composition of COMPARATIVE EXAMPLE 2 indicated in Table 12.
Figure 27:
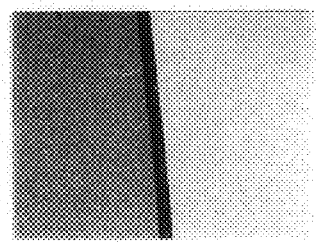
FIG. 27 is a scanning electron microscope (SEM) photograph of an edge after the Edge Bead Removal test on a photosensitive resin B with a thinner composition of EXAMPLE 1 indicated in Table 12.
Figure 28:
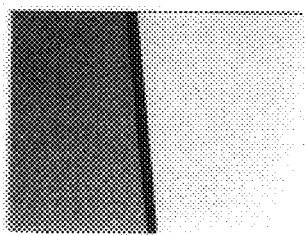
FIG. 28 is a scanning electron microscope (SEM) photograph of an edge after the Edge Bead Removal test on a photosensitive resin B with a thinner composition of EXAMPLE 2 indicated in Table 12.
Figure 29:
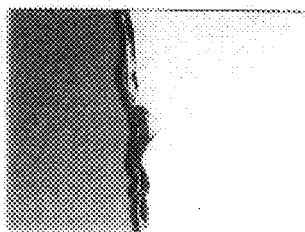
FIG. 29 is a scanning electron microscope (SEM) photograph of an 5 edge after the Edge Bead Removal test on a photosensitive resin B with a thinner composition of COMPARATIVE EXAMPLE 1 indicated in Table 12.
Figure 30:
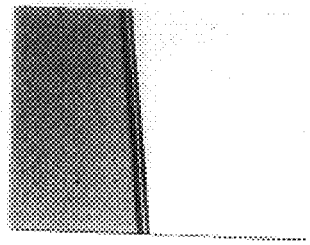
FIG. 30 is a scanning electron microscope (SEM) photograph of an edge after the Edge Bead Removal test on a photosensitive resin B with a thinner composition of COMPARATIVE EXAMPLE 2 indicated in Table 12.
Figure 31:
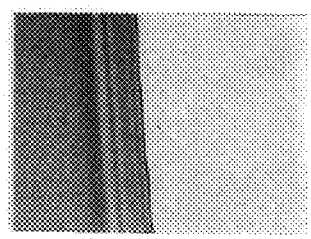
FIG. 31 is a scanning electron microscope (SEM) photograph of an edge after the Edge Bead Removal test on a photosensitive resin C with a thinner composition of EXAMPLE 1 indicated in Table 12.
Figure 32:
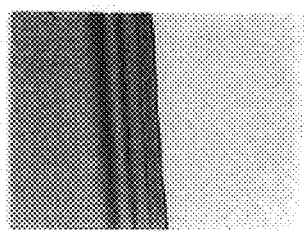
FIG. 32 is a scanning electron microscope (SEM) photograph of an edge after the Edge Bead Removal test on a photosensitive resin C with a thinner composition of EXAMPLE 2 indicated in Table 12.
Figure 33:
FIG. 33 is a scanning electron microscope (SEM) photograph of an edge after the Edge Bead Removal test on a photosensitive resin C with a thinner composition of COMPARATIVE EXAMPLE 1 indicated in Table 12.
Figure 34:
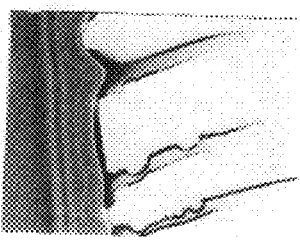
FIG. 34 is a scanning electron microscope (SEM) photograph of an edge after the Edge Bead Removal test on a photosensitive resin C with a thinner composition of COMPARATIVE EXAMPLE 2 indicated in Table 12.
Figure 35:
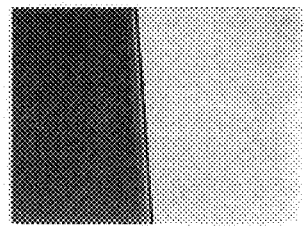
FIG. 35 is a scanning electron microscope (SEM) photograph of an edge after the Edge Bead Removal test on a photosensitive resin D with a thinner composition of EXAMPLE 1 indicated in Table 12.
Figure 36:
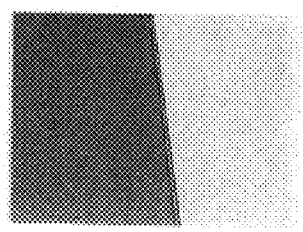
FIG. 36 is a scanning electron microscope (SEM) photograph of an edge after the Edge Bead Removal test on a photosensitive resin D with a thinner composition of EXAMPLE 2 indicated in Table 12.
Figure 37:
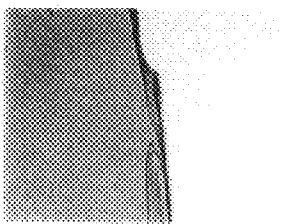
FIG. 37 is a scanning electron microscope (SEM) photograph of an edge after the Edge Bead Removal test on a photosensitive resin D with a thinner composition of COMPARATIVE EXAMPLE 1 indicated in Table 12.
Figure 38:
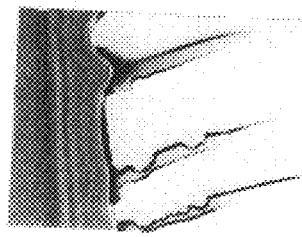
FIG. 38 is a scanning electron microscope (SEM) photograph of an edge after the Edge Bead Removal test on a photosensitive resin D with a thinner composition of COMPARATIVE EXAMPLE 2 indicated in Table 12.

| Classification | EXAMPLE 1 | EXAMPLE 2 | COMPARATIVE EXAMPLE 1 | COMPARATIVE EXAMPLE 3 |
|---|---|---|---|---|
| Composition (wt %) | PGME 80 EPE 10 BE 5 EL 5 | PGME 70 EPE 10 BE 10 EL 10 | PGMEP 60 PGMEA 40 | PGME 50 EL 50 |
| SEM observation after EBR test on photoresist A | FIG. 23 | FIG. 24 | FIG. 25 | FIG. 26 |
| SEM observation after EBR test on photoresist B | FIG. 27 | FIG. 28 | FIG. 29 | FIG. 30 |
| SEM observation after EBR test on photoresist C | FIG. 31 | FIG. 32 | FIG. 33 | FIG. 34 |
| SEM observation after EBR test on photoresist D | FIG. 35 | FIG. 36 | FIG. 37 | FIG. 38 |

TABLE 13

Edge observation results during the High Spin Speed (2800 rpm) change Edge Bead Removal (EBR) test evaluation of thinner compositions

Figure 39:
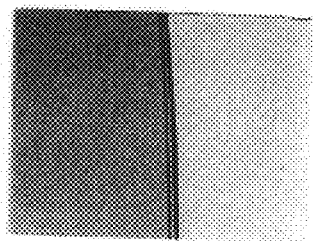
FIG. 39 is a scanning electron microscope (SEM) photograph of an edge after the Edge Bead Removal test on a photosensitive resin A with a thinner composition of EXAMPLE indicated in Table 13.
Figure 40:
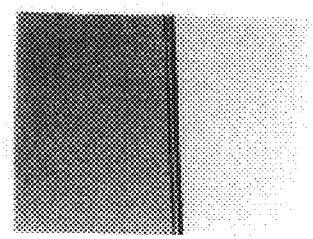
FIG. 40 is a scanning electron microscope (SEM) photograph of an edge after the Edge Bead Removal test on a photosensitive resin A with a thinner composition of EXAMPLE 2 indicated in Table 13.
Figure 41:
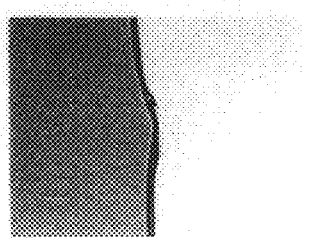
FIG. 41 is a scanning electron microscope (SEM) photograph of an edge after the Edge Bead Removal test on a photosensitive resin A with a thinner composition of COMPARATIVE EXAMPLE 1 indicated in Table 13.
Figure 42:
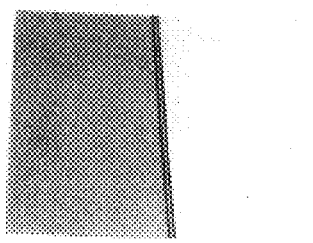
FIG. 42 is a scanning electron microscope (SEM) photograph of an edge after the Edge Bead Removal test on a photosensitive resin A with a thinner composition of COMPARATIVE EXAMPLE 2 indicated in Table 13.
Figure 43:
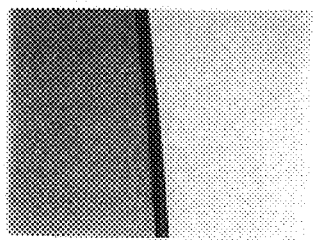
FIG. 43 is a scanning electron microscope (SEM) photograph of an edge after the Edge Bead Removal test on a photosensitive resin B with a thinner composition of EXAMPLE 1 indicated in Table 13.
Figure 44:
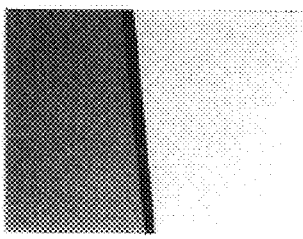
FIG. 44 is a scanning electron microscope (SEM) photograph of an edge after the Edge Bead Removal test on a photosensitive resin B with a thinner composition of EXAMPLE 2 indicated in Table 13.
Figure 45:
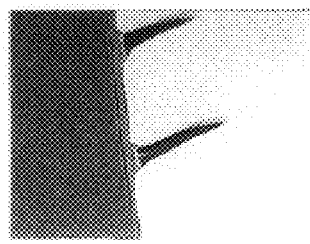
FIG. 45 is a scanning electron microscope (SEM) photograph of an edge after the Edge Bead Removal test on a photosensitive resin B with a thinner composition of COMPARATIVE EXAMPLE 1 indicated in Table 13.
Figure 46:
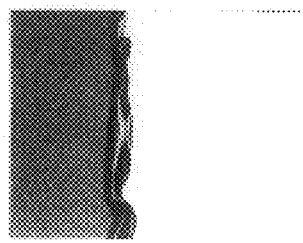
FIG. 46 is a scanning electron microscope (SEM) photograph of an edge after the Edge Bead Removal test on a photosensitive resin B with a thinner composition of COMPARATIVE EXAMPLE 2 indicated in Table 13.
Figure 47:
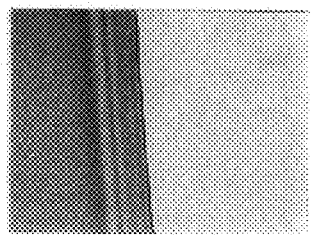
FIG. 47 is a scanning electron microscope (SEM) photograph of an edge after the Edge Bead Removal test on a photosensitive resin C with a thinner composition of EXAMPLE 1 indicated in Table 13.
Figure 48:
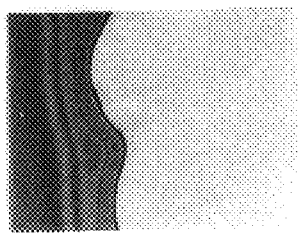
FIG. 48 is a scanning electron microscope (SEM) photograph of an edge after the Edge Bead Removal test on a photosensitive resin C with a thinner composition of EXAMPLE 2 indicated in Table 13.
Figure 49:
FIG. 49 is a scanning electron microscope (SEM) photograph of an edge after the Edge Bead Removal test on a photosensitive resin C with a thinner composition of COMPARATIVE EXAMPLE 1 indicated in Table 13.
Figure 50:
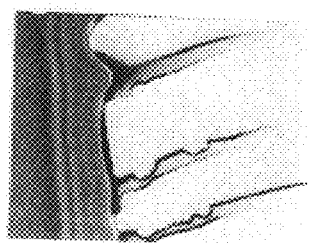
FIG. 50 is a scanning electron microscope (SEM) photograph of an edge after the Edge Bead Removal test on a photosensitive resin C with a thinner composition of COMPARATIVE EXAMPLE 2 indicated in Table 13.
Figure 51:
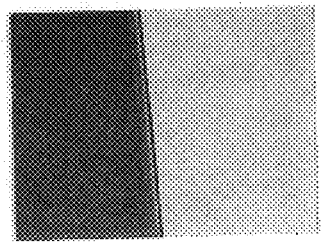
FIG. 51 is a scanning electron microscope (SEM) photograph of an edge after the Edge Bead Removal test on a photosensitive resin D with a thinner composition of EXAMPLE 1 indicated in Table 13.
Figure 52:
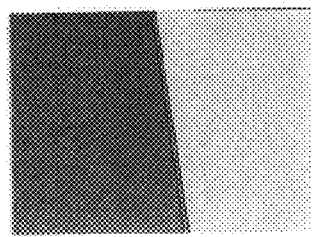
FIG. 52 is a scanning electron microscope (SEM) photograph of an edge after the Edge Bead Removal test on a photosensitive resin D with a thinner composition of EXAMPLE 2 indicated in Table 13.
Figure 53:
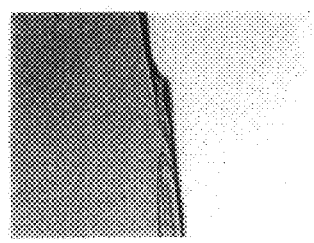
FIG. 53 is a scanning electron microscope (SEM) photograph of an edge after the Edge Bead Removal test on a photosensitive resin D with a thinner composition of COMPARATIVE EXAMPLE 1 indicated in Table 13.
Figure 54:
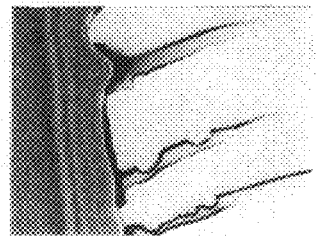
FIG. 54 is a scanning electron microscope (SEM) photograph of an edge after the Edge Bead Removal test on a photosensitive resin D with a thinner composition of COMPARATIVE EXAMPLE 2 indicated in Table 13.

| Classification | EXAMPLE 1 | EXAMPLE 2 | COMPARATIVE EXAMPLE 1 | COMPARATIVE EXAMPLE 3 |
|---|---|---|---|---|
| Composition (wt %) | PGME 80 EPE 10 BE 5 EL 5 | PGME 70 EPE 10 BE 10 EL 10 | PGMEP 60 PGMEA 40 | PGME 50 EL 50 |
| SEM observation after EBR test on photoresist A | FIG. 39 | FIG. 40 | FIG. 41 | FIG. 42 |
| SEM observation after EBR test on photoresist B | FIG. 43 | FIG. 44 | FIG. 45 | FIG. 46 |
| SEM observation after EBR test on photoresist C | FIG. 47 | FIG. 48 | FIG. 49 | FIG. 50 |
| SEM observation after EBR test on photoresist D | FIG. 51 | FIG. 52 | FIG. 53 | FIG. 54 |

As represented in the above Tables 10, 11, 12, and 13, the thinner compositions according to the present invention maintain the equally excellent profile shapes even while varying the EBR rpm conditions. This means that a thinner composition according to the present invention shows not only an effect at the specific conditions, but also equal performance at various conditions, being more stable than the conventional thinner compositions under process condition changes.

EXAMPLE 6

As to the EBR test of a spin-on-glass solution, the test conditions were as follows.

After a spin-on-glass (SOG) solution (a product of TOK Company, Model No. TCPS 190) of 1.5 ml was dropped on the center of an 8-inch silicon oxide substrate, a SOG composition was spun using a spin-coater at 50 rpm for 2 seconds. Then, the substrate was accelerated to 2800 rpm, adjusting the thickness of the SOG solution to a predetermined level. The SOG layer thickness was 0.3 μm at this time.

After a SOG solution was coated on substrates in this manner, EBR tests were performed using the thinner compositions of EXAMPLES 1 to 4, and the conventional thinner compositions of COMPARATIVE EXAMPLES 1 to 3.

The EBR test conditions were as represented in Table 14, and an evaluation and the edge shapes resulting from the thinner compositions on SOG after the EBR test are provided in Table 15.

TABLE 14

Edge Bead Removal (EBR) Test Conditions

| Classification | Spin speed (rpm) | Time (sec) |
|---|---|---|
| Dispensing condition | 50 | 2 |
| Spin coating | 2800 | 8 |
| EBR condition | 2500 | 5 |
| Drying condition | 3000 | 5 |

TABLE 15

Evaluation and edge shapes after the Edge Bead Removal (EBR) test of thinner compositions on a spin-on-glass (SOG)

Figure 55:
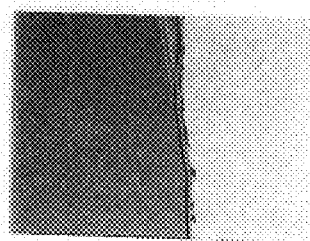
FIG. 55 is a scanning electron microscope (SEM) photograph of an edge after the Edge Bead Removal test on a spin-on-glass (SOG) solution with a thinner composition of EXAMPLE 1 indicated in Table 15.
Figure 56:
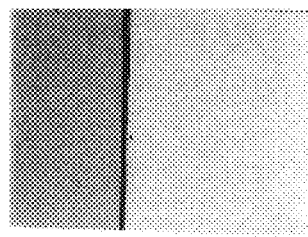
FIG. 56 is a scanning electron microscope (SEM) photograph of an edge after the Edge Bead Removal test on a spin-on-glass (SOG) solution with a thinner composition of EXAMPLE 2 indicated in Table 15.
Figure 57:
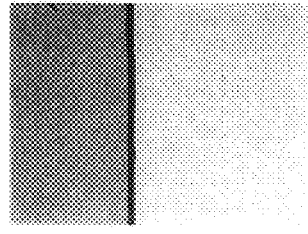
FIG. 57 is a scanning electron microscope (SEM) photograph of an edge after the Edge Bead Removal test on a spin-on-glass (SOG) solution with a thinner composition of EXAMPLE 3 indicated in Table 15.
Figure 58:
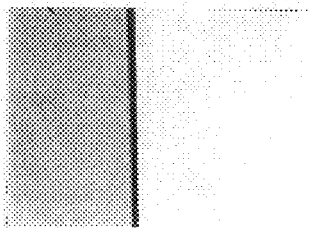
FIG. 58 is a scanning electron microscope (SEM) photograph of an edge after the Edge Bead Removal test on a spin-on-glass (SOG) solution with a thinner composition of EXAMPLE 4 indicated in Table 15.
Figure 59:
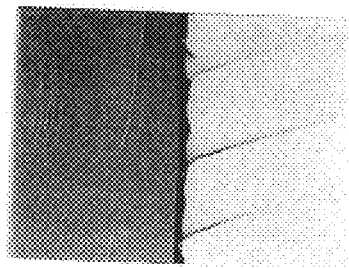
FIG. 59 is a scanning electron microscope (SEM) photograph of an edge after the Edge Bead Removal test on a spin-on-glass (SOG) solution with a thinner composition of COMPARATIVE EXAMPLE 1 indicated in Table 15.
Figure 60:
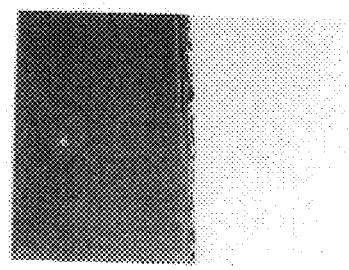
FIG. 60 is a scanning electron microscope (SEM) photograph of an edge after the Edge Bead Removal test on a spin-on-glass (SOG) solution with a thinner composition of COMPARATIVE EXAMPLE 2 indicated in Table 15.
Figure 61:
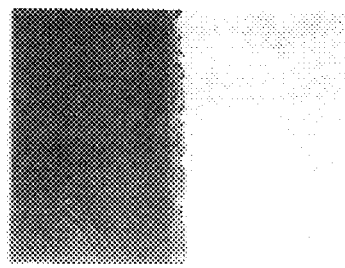
FIG. 61 is a scanning electron microscope (SEM) photograph of an edge after the Edge Bead Removal test on a spin-on-glass (SOG) solution with a thinner composition of COMPARATIVE EXAMPLE 3 indicated in Table 15.

| Classification | EXAMPLE 1 | EXAMPLE 2 | EXAMPLE 3 | EXAMPLE 4 | COM. EXAMPLE 1 | COM. EXAMPLE 2 | COM. EXAMPLE 3 |
|---|---|---|---|---|---|---|---|
| Compositions (wt %) | PGME 80 EPE 10 BE 5 EL 5 | PGME 70 EPE 10 BE 10 EL 10 | PGME 75 MBM 15 BE 8 EL 2 | PGME 60 MBM 30 BE 9 EL 1 | PGMEP 60 PGMEA 40 | PGME 50 EL 50 | PGME 70 PGMEA 30 |
| Evaluation | Δ | ○ | ○ | ○ | X | Δ | X |
| Edge shape | FIG. 55 | FIG. 56 | FIG. 57 | FIG. 58 | FIG. 59 | FIG. 60 | FIG. 61 |

In the above Table 15, an evaluation mark O indicates a clear edge part shape after the EBR, an evaluation mark Δ indicates a distorted edge shape after the EBR caused by photoresist attack, and X indicates the tailing phenomena of an edge part after the EBR.

As represented in the above Table 15, the thinner compositions according to the present invention show excellent EBR effects on photoresists as well as on SOG. Therefore, in the semiconductor component manufacturing process, a single thinner composition can be used in the various process steps so that thinner supplying equipment compatibility can be obtained. Hence, the thinner supplying equipment and the process control are simplified, and costs are reduced.

There are further beneficial effects of semiconductor component manufacturing process simplification and production yield improvement as various coating compositions, including a various types of photoresists as well as SOG compositions, can be removed rapidly and economically by using a four constituent based thinner composition. This composition is differentiated from the conventional thinner compositions in the washing and photoresist removal of an edges and a back side of a substrate by spraying through a nozzle according to the present invention.

Furthermore, the present invention provides the beneficial effect of substrate recycling and economical use in that a defective substrate can be reused by removing photoresists adhered to its surface. Additionally, substrates selected randomly for process control tests can also be easily recycled by utilizing this present invention.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thinner composition for removing unnecessary photoresist on a wafer or substrate in the semiconductor device manufacturing process, wherein the thinner composition comprises:

a) propylene glycol monoalkyl ether of 40 to 80 wt %;

b) monooxycarbonic acid ester of 10 to 30 wt %;

c) alkyl ethanoate of 1 to 20 wt %; and d) alkyl lactate of 1 to 20 wt %.

2. A thinner composition in accordance with claim 1, wherein the propylene glycol monoalkyl ether is selected from a group comprising propylene glycol monomethyl ether, propylene glycol monoethyl ether, propylene glycol monopropyl ether, and propylene glycol monobutyl ether.

3. A thinner composition in accordance with claim 1, wherein the monooxycarbonic acid ester is selected from the group consisting of 3-methoxypropionic acid methyl ester, 3-ethoxypropionic acid ethyl ester, 3-methoxypropionic acid ethyl ester, 3-ethoxypropionic acid methyl ester, 2-methoxyacetic acid methyl ester, 2-ethoxyacetic acid ethyl ester, 2-hydroxypropionic acid methyl ester, 2-hydroxypropionic acid ethyl ester, 2-hydroxypropionic acid propyl ester, 2-methoxypropionic acid ethyl ester, 2-ethoxypropionic acid propyl ester, 2-ethoxypropionic acid ethyl ester, β-methoxyisobutyric acid methyl ester, and α-hydroxyisobutyric acid methyl ester.

4. A thinner composition in accordance with claim 1, wherein the alkyl ethanoate is selected from the group consisting of methyl ethanoate, ethyl ethanoate, and butyl ethanoate.

5. A thinner composition in accordance with claim 1, wherein the alkyl lactate is selected from the group consisting of methyl lactate, ethyl lactate, and butyl lactate.

* * * * *

UNITED STATES PATENT AND TRADEMARK OFFICE
CERTIFICATE OF CORRECTION

PATENT NO. : 6,183,942 B1  
DATED : February 6, 2001  
INVENTOR(S) : Kim et al.

Page 1 of 1

It is certified that error appears in the above-identified patent and that said Letters Patent is hereby corrected as shown below:

<u>Title page,</u>  
Item [56], References Cited, FOREIGN PATENT DOCUMENTS,  
"936110     2/1997  (JP)" should read -- 936110     2/1997  (JP) -- ; and  
"62230828     7/1995  (JP)" should read -- 62230828     10/1987  (JP) --

OTHER PUBLICATIONS,  
"Vaccum" should read -- Vacuum --

Item [57], ABSTRACT,  
Line 18, "reuse" should read -- reused --

Signed and Sealed this

Twelfth Day of March, 2002

*Attest:*

*Attesting Officer*

JAMES E. ROGAN  
*Director of the United States Patent and Trademark Office*